(12) United States Patent
Feldhues et al.

(10) Patent No.: US 8,512,823 B2
(45) Date of Patent: Aug. 20, 2013

(54) PROCESS FOR PREPARING METAL COMPOUNDS OF AN AZO COMPOUND IN THE PRESENCE OF SEED CRYSTALS

(75) Inventors: Ulrich Feldhues, Bergisch Gladbach (DE); Frank Linke, Köln (DE); Ronald Göbel, Leverkusen (DE); Sabine Endert, Wuppertal (DE); Dirk Pfuetzenreuter, Burscheid (DE)

(73) Assignee: LANXESS Deutschland GmbH, Leverkusen (DE)

( * ) Notice: Subject to any disclaimer, the term of this patent is extended or adjusted under 35 U.S.C. 154(b) by 1329 days.

(21) Appl. No.: 11/486,577

(22) Filed: Jul. 14, 2006

(65) Prior Publication Data

US 2007/0020409 A1 Jan. 25, 2007

(30) Foreign Application Priority Data

Jul. 19, 2005 (DE) .................. 10 2005 033 580

(51) Int. Cl.
| | | |
|---|---|---|
| C09B 45/14 | (2006.01) | |
| C09B 45/22 | (2006.01) | |
| G02F 1/13 | (2006.01) | |
| C09K 19/00 | (2006.01) | |

(52) U.S. Cl.
USPC ........... 428/1.31; 349/187; 534/701; 534/702

(58) Field of Classification Search
None
See application file for complete search history.

(56) References Cited

U.S. PATENT DOCUMENTS

| | | | |
|---|---|---|---|
| 3,869,439 A | 3/1975 | Schundehutte | |
| 3,944,540 A | 3/1976 | Burt et al. | 260/186 |
| 3,976,646 A * | 8/1976 | Beaudet | 544/371 |
| 4,622,391 A | 11/1986 | Lorenz et al. | |
| 4,628,082 A | 12/1986 | Lorenz et al. | |
| 4,638,052 A | 1/1987 | Kawamura et al. | |
| 5,436,322 A | 7/1995 | Orban et al. | 534/581 |
| 6,211,346 B1 | 4/2001 | Linke et al. | 534/707 |
| 6,264,358 B1 | 7/2001 | Sommer et al. | |
| 6,350,307 B1 | 2/2002 | Linke et al. | |
| 6,448,385 B2 | 9/2002 | Herrmann et al. | |
| 6,596,446 B2 | 7/2003 | Wolf et al. | |
| 6,881,830 B2 * | 4/2005 | Feldhues et al. | 534/602 |
| 2002/0034696 A1 | 3/2002 | Wolf et al. | 430/7 |
| 2002/0111465 A1 | 8/2002 | Linke et al. | 534/703 |
| 2005/0054840 A1 * | 3/2005 | Bossoutrot | 534/586 |
| 2007/0017414 A1 * | 1/2007 | Feldhues et al. | 106/31.13 |
| 2007/0017416 A1 * | 1/2007 | Feldhues et al. | 106/496 |
| 2007/0020408 A1 * | 1/2007 | Feldhues et al. | 428/1.31 |
| 2008/0057417 A1 * | 3/2008 | Feldhues et al. | 430/7 |

FOREIGN PATENT DOCUMENTS

| | | |
|---|---|---|
| DE | 10213980 | 10/2003 |
| DE | 10328999 | 1/2005 |

OTHER PUBLICATIONS

Batista et al., Vestnik Slovenskega Kemijskega Drustva, 34(3), 289-304, 1987.*
Levin et al., English Translation of Khim. Prom., No. 2, 16-18, 1947.*
Roth et al., "Surface Ares of Ultrafine Particles", J. Aerosol. Sci., vol. 31, Suppl. 1, S198-S199, 2000.*
Jones, A.G., "Crystallization Process Systems", Chapter 9, Design of Crystallization Process Systems, Elsevier Butterworth-Heinemann, Woburn, Massachusetts, pp. 261-298, 2002.*
Herbst, Hunger; "Industrial Organic Pigments", 1993, pp. 30-31, 40-45, 205-207.
Zhang, Gang et al. Translation of the Part of D2 cited by the Chinese Examiner "Seeding Technology on the Precipitation Crystallization Process" (School of Chemical Engineering of Tianjin University, Tianjin 300072, China) pp. 1-3.

* cited by examiner

*Primary Examiner* — Kamal Saeed
(74) *Attorney, Agent, or Firm* — Michael A. Miller

(57) ABSTRACT

Process for preparing metal compounds of an azo compound which conforms in the form of its tautomeric structures to the formula (I)

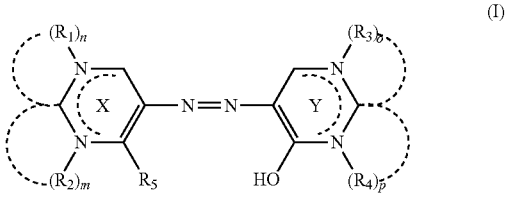

characterized in that the preparation takes place in the presence of seed crystals.

11 Claims, No Drawings

PROCESS FOR PREPARING METAL COMPOUNDS OF AN AZO COMPOUND IN THE PRESENCE OF SEED CRYSTALS

The invention relates to a process for preparing metal compounds of an azo compound in the presence of seed crystals, to the use of the metal compounds as pigments, and to the use of the pigments.

Metal complex pigments of metals with an azo compound of the following formula

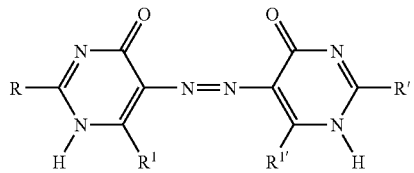

in which
R and R' independently of one another are OH, $NH_2$, NH—CN, arylamino or acylamino
and
$R^1$ and $R^{1'}$ independently of one another are —OH or —$NH_2$,
and also host-guest compounds thereof, are extensively described in the literature, examples being:
DE-A-2 064 093
U.S. Pat. No. 4,622,391
EP 0 994 162 A1
EP 0 994 163 A1
EP 0 994 164 A1
DE 103 28 999 A1.

It is known that the preparation of the above-described metal compounds or host-guest compounds thereof is accompanied by relatively severe fluctuations in product properties. In particular under industrial-scale production conditions, and especially in a batch process, certain parameters of the material obtained, such as the BET specific surface area, for example, are subject to more or less severe fluctuations. This is of course a disadvantage, since the consumers of the stated compounds desire consistent product quality. Moreover, particularly before the production of colour filters for liquid-crystal displays, product grades with high BET surface areas are desired.

The outlined disadvantages of the batch process are described at length in EP-A-1142960. The continuous preparation process described therein necessitates considerable additional apparatus, in particular a plurality of vessels for starting material, a mixing reactor, and volume- and pH-controlled regulating, pumping and safety systems, which must be harmonized with one another with extreme precision.

It is possible to impose a certain uniformity on product quality (reproducibility) by means of a heat treatment step, as described for example in EP-A1-0994162 or DE 10328999 A1. This is achieved at the expense, though, of a reduction in the BET specific surface area, which can be disadvantageous, particularly for application in producing colour filters for liquid-crystal displays.

It was an object of the invention, accordingly, to find a process for preparing the aforementioned metal compounds that increases the reproducibility of the preparation of the metal compounds or host-guest compounds thereof, and which in particular allows the reproducible formation of a product possessing a high BET surface area. Fluctuations in product quality ought to be extremely small.

The invention relates to a process for preparing metal compounds of an azo compound of the formula (I)

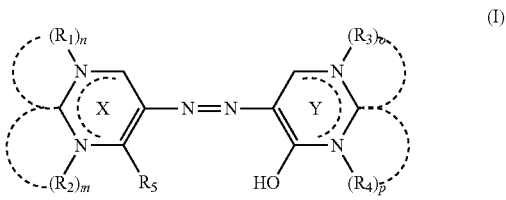

or tautomeric structures thereof,
in which
rings labelled X and Y may each carry one or two substituents from the series =O, =S, =$NR_7$, —$NR_6R_7$, —$OR_6$, —$SR_6$, —$COOR_6$, —CN, —$CONR_6R_7$, —$SO_2R_8$,

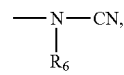

alkyl, cycloalkyl, aryl and aralkyl,
the sum of the endocyclic and exocyclic double bonds for each of rings X and Y being three,
in which
$R_6$ is hydrogen, alkyl, cycloalkyl, aryl or aralkyl,
$R_7$ is hydrogen, cyano, alkyl, cycloalkyl, aryl, aralkyl or acyl, and
$R_8$ is alkyl, cycloalkyl, aryl or aralkyl,
$R_1$, $R_2$, $R_3$ and $R_4$ are hydrogen, alkyl, cycloalkyl, aryl or aralkyl and additionally, as indicated in formula (I) by the interrupted lines, may form 5- or 6-membered rings, to which further rings may be fused,
$R_5$ is —OH, —$NR_6R_7$, alkyl, cycloalkyl, aryl or aralkyl, in which $R_6$ and $R_7$ are as defined above,
and in the substituents given for $R_1$ to $R_8$ that contain CH groups the hydrogen atoms in the CH groups may be substituted,
and m, n, o and p may be 1 (one) or alternatively, where double bonds start from the ring nitrogen atoms on which the corresponding substituents $R_1$ to $R_4$ are located, as indicated in formula (I) by the dotted lines, may be 0 (zero),
and which optionally contain a guest compound,
characterized in that the preparation takes place in the presence of seed crystals.

In accordance with the invention, metal compounds of an azo compound of the formula (I) are understood in particular to be metal complex compounds of the azo compound of the formula (I) and/or saltlike metal compounds of the azo compound of the formula (I). In the metal compounds prepared in accordance with the invention, the azo compound of the formula (I) is generally present with single or multiple deprotonation as an anion, whereas the metals are present as cations, which are joined in saltlike to complexlike fashion or coordinatively (that is, with covalent bonding components) to the anion of the azo compound of the formula (I). Formula (I) shows the azo compound in the non-deprotonated form, i.e. in the free acid form. The preparation of these complexlike and/or saltlike metal compounds is based preferably on the reaction of the acidic azo compounds of the formula (I) with metal compounds, optionally in the presence of bases, to form the metal compounds of an azo compound of the formula (I).

The metal compounds prepared in accordance with the invention, or the host-guest compounds thereof, can also be in the form of hydrates.

The abovementioned number of substituents on the rings labelled X and Y (one or two substituents) is to be understood in accordance with the invention not to include the drawn-in substituents $R_1$ to $R_5$ and —OH. The stated substituents on the rings labelled X and Y are therefore the substituents which are located on the positions not occupied by $R_1$ to $R_5$. With the substituents $R_1$ to $R_5$, therefore, it is also possible for more than two substituents to be located on the rings labelled X and Y.

In one preferred embodiment of the process of the invention in the compound of the formula (I) the ring labelled X is a ring of the formula

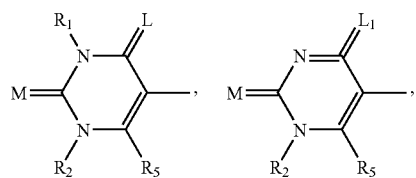

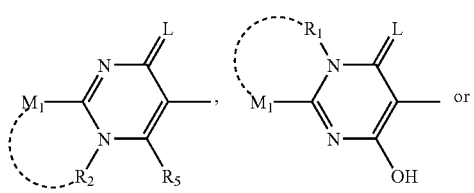

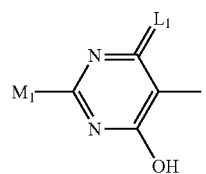

in which

L and M independently of one another are =O, =S or =NR_6, $L_1$ is hydrogen, —$OR_6$, —$SR_6$, —$NR_6R_7$, —$COOR_6$, —$CONR_6R_7$, —CN, alkyl, cycloalkyl, aryl or aralkyl, and $M_1$ is —$OR_6$, —$SR_6$, —$NR_6R_7$, —$COOR_6$, —$CONR_6R_7$, —CN, —$SO_2R_8$,

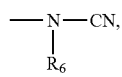

alkyl, cycloalkyl, aryl or aralkyl, or the substituents $M_1$ and $R_1$ or $M_1$ and $R_2$ may form a 5- or 6-membered ring, and $R_1$, $R_2$, $R_5$, $R_6$, $R_7$ and $R_8$ are as defined above.

Particularly preferred metal compounds prepared in accordance with the invention are those of azo compounds which conform in the form of their free acids to structures of the formulae (II) or (III)

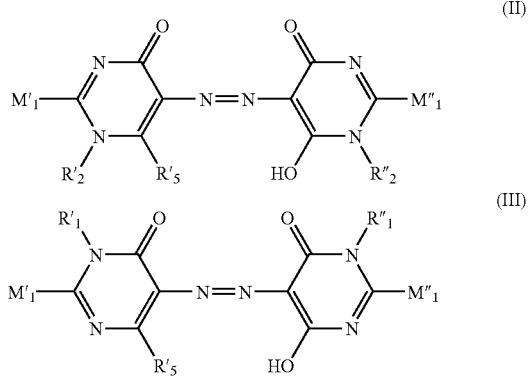

or to a form tautomeric therewith,
in which
$R'_5$ is —OH or —$NH_2$,
$R'_1$, $R''_1$, $R'_2$ and $R''_2$ are each hydrogen, and
$M'_1$ and $M''_1$ independently of one another are hydrogen, —OH, —$NH_2$, —NHCN, arylamino or acylamino.

Especially preferred metal compounds are those of azo compounds of the formula (I) which conform in the form of their free acid to a structure of the formula (IV)

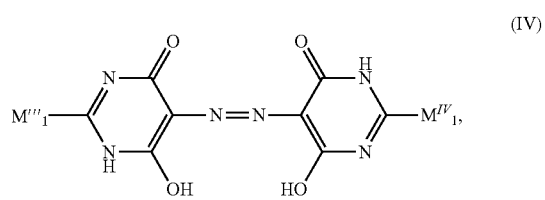

or tautomeric structures thereof,
in which
$M'''_1$ and $M^{IV}_1$ independently of one another are OH and/or NHCN.

Particular preference is given to metal compounds of azo compounds of the formula:

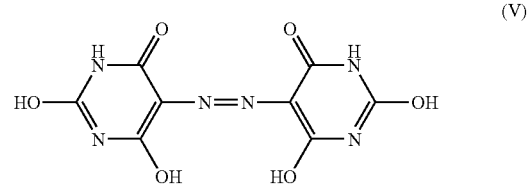 [SMILES: O=c1[nH]c(O)nc(O)c1N=Nc1c(O)nc(O)[nH]c1=O]

or structures tautomeric therewith.

In the above formulae the substituents preferably have the following definitions:

Substituents in the definition of alkyl are preferably $C_1$-$C_6$ alkyl, which may be substituted for example by halogen, such as chlorine, bromine or fluorine, —OH, —CN, —$NH_2$ or $C_1$-$C_6$ alkoxy. $C_1$-$C_6$ Alkyl therein is straight-chain or branched alkyl having 1 to 6 carbon atoms, such as methyl, ethyl, propyl, butyl, pentyl or hexyl, including all isomeric forms thereof.

Substituents in the definition of cycloalkyl are preferably $C_3$-$C_7$ cycloalkyl, especially $C_5$-$C_6$ cycloalkyl, which may be substituted for example by $C_1$-$C_6$ alkyl, $C_1$-$C_6$ alkoxy, halogen such as Cl, Br, F, $C_1$-$C_6$ alkoxy, —OH, —CN and $NH_2$.

Substituents in the definition of aryl are preferably phenyl or naphthyl, which may be substituted for example by halogen such as F, Cl, Br, —OH, $C_1$-$C_6$ alkyl, $C_1$-$C_6$ alkoxy, —$NH_2$, —$NO_2$ and —CN.

Substituents in the definition of aralkyl are preferably phenyl- or naphthyl-$C_1$-$C_4$ alkyl, which may be substituted in the aromatic radicals by for example halogen such as F, Cl, Br, —OH, $C_1$-$C_6$ alkyl, $C_1$-$C_6$ alkoxy, —$NH_2$, —$NO_2$ and —CN.

Substituents in the definition of acyl are preferably ($C_1$-$C_6$ alkyl)-carbonyl, phenylcarbonyl, $C_1$-$C_6$ alkylsulphonyl, phenylsulphonyl, optionally $C_1$-$C_6$ alkyl-, phenyl- and naphthyl-substituted carbamoyl, optionally $C_1$-$C_6$ alkyl-, phenyl- and naphthyl-substituted sulphamoyl or optionally $C_1$-$C_6$ alkyl-, phenyl- or naphthyl-substituted guanyl, the stated alkyl radicals being able to be substituted for example by halogen such as Cl, Br, F, —OH, —CN, —$NH_2$ or $C_1$-$C_6$ alkoxy, and the stated phenyl and naphthyl radicals being able to be substituted by for example halogen such as F, Cl, Br, —OH, $C_1$-$C_6$ alkyl, $C_1$-$C_6$ alkoxy, —$NH_2$, —$NO_2$ and —CN.

Where $M_1$ together with $R_1$ or $M_1$ together with $R_2$ and/or $R_1$, $R_2$, $R_3$ and/or $R_4$, as indicated in the formulae above by means of the interrupted lines, form 5- or 6-membered rings, the ring systems in question are preferably triazole, imidazole or benzimidazole, pyrimidine or quinazoline ring systems.

As metal compounds—by which, as already described, are meant saltlike or complexlike metal compounds—of the azo compounds of the formulae (I) to (V), suitable representatives are preferably the salts and complexes of the mono-, di-, tri- and tetraanions of the azo compounds of the formulae (I) to (V). Suitable metals are selected advantageously from one or more metals selected from the group consisting of Li, Na, K, Mg, Ca, Sr, Ba, Al, Sn, Pb, Sc, Ti, V, Cr, Mn, Fe, Co, Ni, Cu, Zn, Y, Zr, Nb, Mo, Cd, Hf, Ta, W, La, Ce, Pr and Nd.

Particular preference is given to salts and complexes of formulae (I) to (V) with divalent or trivalent metals, especially the nickel salts and nickel complexes. In one preferred embodiment of the processes of the invention an Ni salt or an Ni complex of the azo compound of the formula (I) is prepared.

The metal compound is preferably the 1:1 azobarbituric acid-nickel complex of the structure

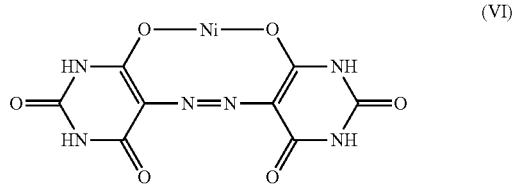

(VI)

or a structure tautomeric therewith.

The metal compounds prepared in accordance with the invention may optionally contain one or more guest compounds. The guest compound is preferably an inorganic compound, i.e. a compound having at least one covalently bonded carbon atom. The compositions of metal compound and guest organic compound that are prepared in accordance with the invention may be inclusions compounds, intercalation compounds or solid solutions.

With preference they are inclusion compounds, intercalation compounds or solid solutions of a 1:1 azobarbituric acid-nickel complex of the structure

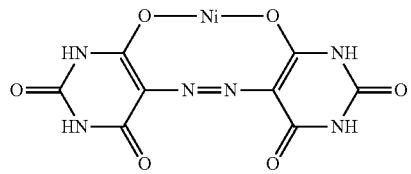

(VI)

or of a structure tautomeric therewith and of at least one other organic compound included therein.

With particular preference they are intercalation compounds of the above-described metal compound of the formula (VI) with melamine in a molar ratio of 1:2.

Generally speaking, the metal compounds prepared in accordance with the invention form laminar crystal lattices in which the bonding within one lamina is essentially by way of hydrogen bonds and/or metal ions. The metal complexes in question preferably form a crystal lattice composed of substantially planar laminae.

The inventive preparation of the metal complexes of the azo compound of the formula (I) or of the host-guest compounds thereof takes place preferably in the presence of seed crystals which possess the same chemical structure as the metal compounds of the azo compound of the formula (I) or host-guest compounds thereof that are to be prepared by the process of the invention. In particular, when the product to be prepared is a composition of a metal compound of the azo compound of the formula (I) and a compound present as a guest therein, use is made also of seed crystals of an inclusion composition of this kind. It has surprisingly emerged that the physical properties of the seed crystals used do not necessarily determine the physical properties of the metal compounds to be prepared. Thus, for example, metal compounds having a high BET specific surface area are obtained even when the seed crystals employed have a comparatively low BET specific surface area.

The inventive preparation takes place preferably in the presence of 1 ppm-10 000 ppm of seed crystals, based on the theoretically obtainable amount of the metal compound to be prepared in a given reaction batch, in particular of 10 ppm-5000 ppm, very preferably of 50 ppm-3000 ppm, in particular of 100 ppm-2000 ppm.

In accordance with the invention it is possible with advantage to prepare metal compounds of the azo compounds of the formula (I) which preferably contain a guest compound, and pigments corresponding to them, having very high BET specific surface areas, particularly for LCD applications.

Thus by the process of the invention it is possible to obtain BET specific surface areas of the metal compounds of the azo compounds of the formula (I) or of the composition with at least one guest compound thereof that are at least 180 m2/g, such as between 180 and 240 $m^2$/g, in particular between 180 and 210 $m^2$/g. The specific surface area is determined in accordance with DIN 66131: Determination of specific surface area of solids by gas adsorption by the method of Brunauer, Emmett and Teller (B.E.T.).

For certain applications it can be sensible to subject the metal compounds or host-guest compounds thereof obtained by the process of the invention to heat treatment, as described in EP-A1-0994162. Heat treatment generally produces a narrower particle size distribution. As described at the outset, however, this is also generally accompanied by a reduction in specific surface area. If a heat treatment is carried out nevertheless, one preferred embodiment comprises heat-treating the prepared aqueous suspension of the metal compound or host-guest compound thereof in at least two pH stages. This allows a significantly improved colour strength to be obtained as compared with single-stage heat treatment. The multi-stage heat treatment takes place advantageously in each treatment step at temperatures between 80 to 125° C. The multi-stage heat treatment is carried out preferably in the presence of water and optionally organic solvents at pH values in the range from 0 to 4. The pH of at least one heat treatment stage is preferably between 2 and 4, in particular between 2.5 and 3.5. The pH of a second heat treatment stage is preferably between 0 and 3, more preferably between 1 and 2.5. The pH values of two heat treatment stages preferably differ by 0.5 to 3 units, preferably by 1 to 2 units. Preferably at least two heat treatment stages last independently of one another between 0.25 h and 24 h, in particular between 1 h and 12 h, very preferably between 2 h and 8 h.

The use of seed crystals and also, optionally, of pumped circulation, however, may also be sensible when employing a heat treatment method, since the advantage of the reduced fluctuation in product quality is retained and prior to heat treatment it is possible to start from a higher level of specific surface area.

The process of the invention using seed crystals does not lead necessarily to BET specific surface areas of more than 180 m²/g. The reason for this is that, as the skilled person is aware, the setting of a specific surface area is also dependent on other preparation parameters, such as the preparation temperature, for example. Under otherwise advantageous preparation conditions, however, the process of the invention does lead with greater reproducibility to a higher BET specific surface area for the metal compounds prepared in accordance with the invention.

In one particularly preferred process of the invention the seed crystals are in the reaction medium during or before the beginning of azo coupling, more preferably that of diazobarbituric acid with barbituric acid to give azobarbituric acid.

Particularly preferred starting materials are barbituric acid and diazobarbituric acid containing seed crystals, in particular salts of azo barbituric acid, preferably of the sodium, potassium or nickel salt, which may also be present preferably as intercalation compounds, particularly of melamine.

Starting materials likewise preferred are azobarbituric acid and its salts, particularly the sodium, disodium, potassium and dipotassium salts, containing seed crystals, especially nickel-azobarbituric acid, preferably as an intercalation compound, in particular with melamine.

The process of the invention is preferably carried out batchwise, i.e., as what is called a batch process. The term "batch process", as the skilled person is well aware, means a discontinuous process. That is, the preparation of the metal compounds is carried out not continuously but instead in batches, or batchwise. After one reaction batch has been completed, the product is isolated. In the case of the continuous process, in contrast, starting materials are continuously supplied and product continuously removed.

One particularly preferred process of the invention comprises seed crystals being introduced into the reactor by leaving behind the desired amount of product from a precursor batch, or leaving it therein. Leaving behind the desired amount of product is something which can be employed with economic advantage in the case of serial production in particular.

In the context of this specification the metal compounds of the azo compounds of the formula (I), which preferably contain at least one guest compound and have been prepared in the presence of seed crystals, are also referred to as inventively prepared pigments.

Suitable metal compounds include those in which a metallic compound, such as a salt or a metal complex, has been incorporated into the crystal lattice of another metal complex, such as the nickel complex, for example. In this case it is possible for some of the metal, such as of the nickel, in formula (VI), for example, to be replaced by other metal ions, or further metal ions may enter into a more or less strong interaction with the metal compound, preferably a nickel complex.

Inclusion compounds, intercalation compounds and solid solutions of the metal complexes per se are known from the literature. They are also described, and their preparation, in EP 0 074 515, EP 0 073 463, EP 0994163 and EP 0994162 (page 5, line 40 to page 7, line 58 therein), for example. Reference may thus be made to the entire content of the recitation of suitable compounds in those publications.

Particularly preferred guest compounds used are melamine or melamine derivatives, particularly those of the formula (VII)

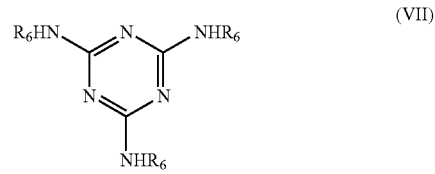

in which
$R_6$ is hydrogen or $C_1$-$C_4$ alkyl, which is optionally substituted by OH groups,
and very preferably those in which
$R_6$ is hydrogen.

The amount of guest substance which can be incorporated into the crystal lattice of the metal complex is generally 5% to 200% by weight, based on the amount of metal compound. It is preferred to incorporate 10% to 100% by weight. This is the amount of guest substance which cannot be removed by washing with appropriate solvents, and which is apparent from elemental analysis. It is of course also possible to add more or less than the stated amount of substance, and an optional possibility is to not wash out any excess. Preference is given to amounts from 10% to 150% by weight, based on the amount of metal compound.

The preparation of the metal compounds or of the host-guest compounds thereof takes place for example as described in EP 0 074 515, EP 0 073 463, EP 0994163 and EP 0994162. Following the synthesis of the azo compound, complexing is carried out with a metal salt, generally in the presence of the compound to be intercalated. In the case of intercalation compounds of complexes of divalent and trivalent metals that are of industrial interest, particularly of the technically and economically important intercalation compound of the azobarbituric acid-nickel complex, complexing and intercalation, and also the subsequent isolation, take place advantageously in the acidic pH range.

Metal salt suitability is possessed preferably by water-soluble salts of the abovementioned metals, especially chlorides, bromides, acetate, nitrates, etc., preferably of nickel. Metal salts employed with preference possess a water solubility of more than 20 g/l, in particular more than 50 g/l at 20° C.

It is also possible to use mixtures of these salts comprising various of the stated metals. The use of such salt mixtures is advisable in particular for the obtainment of intermediate hues of the coloured end products.

In one preferred embodiment the process of the invention is carried out as a batch process in a reactor, such as in a stirred tank reactor, preferably with application of pumped circulation. "Pumped circulation" here denotes that means are provided with which contents can be removed from the reactor during the preparation and passed back to it again. A preferred embodiment of such pumped circulation involves the reactor used, in particular a stirred tank, having a pipeline system which is preferably situated outside the reactor. The pipeline system is connected to the reactor or reactor contents at at least two different points. The pipeline system includes means with which reactor contents can be taken from the reactor at one or more points and, after passing through the pipeline system, can be passed back again at one or more other points. Particular means of this kind are pumps. The pump circulation system used in accordance with the invention preferably features metering devices which allow reaction partners, examples of which are starting materials, solutions of starting materials, acids, bases, etc., to be introduced into the pipeline system situated outside the reactor.

One particularly preferred process of the invention comprises metering acids and bases not directly into the reactor but instead into the pumped circulation system. A particularly preferred process of the invention comprises metering reactants, acids and/or alkalis or bases in such a way that the metering time is 0.2 times-5 times that of a theoretical total pumped circulation cycle, in particular 1 times-2 times. The theoretical total pumped circulation cycle denotes the period of time within which the volume of the reactor contents has passed once through the pumped circulation system.

It is assumed that the pumped circulation creates a region which exhibits a comparatively high flow velocity. This flow velocity is generally higher than the flow velocity in the stirred tank reactor at points of low stirring effect, such as in the region above the topmost stirring blade, for example. In the case of metered addition in the region of the pumped circulation system it is possible in particular, by virtue of the high flow velocity which prevails there, to avoid local peaks in concentration. Furthermore, better commixing of the reactor contents overall is ensured. The process of the invention produces, surprisingly, a product which has an even higher specific surface area than a product prepared without pumped circulation methods. Moreover, the use of pumped circulation leads to an additional reduction in the fluctuations in product quality. Two or more pumped circulation systems can be employed in parallel.

The suspension obtained in the preparation is preferably filtered and the presscake thus obtained can be dried, optionally after washing with water.

Suitable drying methods in this context include, on the one hand, customary methods such as paddle drying, etc. Drying methods of this kind, and subsequent, conventional grinding of the pigment, produce pigments in powder form.

The presscake is preferably spray-dried in the form of an aqueous slurry. The slurry for spraying has a solids fraction preferably of 10% to 40% by weight, in particular 15% to 30% by weight.

The invention further provides a process for preparing pigment formulations, in which at least one inventively prepared metal compound or host-guest compound thereof and at least one dispersant are mixed. These pigment formulations serve preferably for incorporation into aqueous systems.

In respect of suitable dispersants reference may be made to the prior art mentioned at the outset, in particular EP-A1-0994164, page 9, line 56 to page 11, line 23, whose disclosure content is part of this specification. With particular preference the pigment formulation contains more than 90%, in particular more than 95%, preferably more than 97% by weight of pigment (inventively prepared metal compound+optionally compound(s) as guest(s) variant) and dispersant.

The invention additionally relates to the inventively prepared metal compounds or the host-guest compounds thereof (preferably with melamine) having a BET specific surface area of at least 180 $m^2/g$, such as between 180 $m^2/g$ and 240 $m^2/g$, in particular between 180 and 210 $m^2/g$, and also provides a photoresist which comprises the stated metal compounds or host-guest compounds, at least one photocurable monomer and at least one photoinitiator. The invention additionally provides colour filters and liquid-crystal displays produced therefrom that comprise the inventively prepared metal compounds or the host-guest compounds thereof having a BET specific surface area of at least 180 $m^2/g$, such as between 180 $m^2/g$ and 240 $m^2/g$. In the production of colour filters for liquid-crystal displays the inventively prepared metal compound or the host-guest compound thereof (preferably with melamine) having a BET specific surface area of at least 180 $m^2/g$, such as between 180 $m^2/g$ and 240 $m^2/g$, is ground in an organic solvent, with or without the addition of a binder resin and/or dispersant, and then processed, with the addition of photocurable monomers, photoreaction initiators and optionally further binder and/or solvent, to give a photoresist, which is subsequently applied by means of appropriate coating methods, such as roller, spray, spin, dip or air-knife coating, for example, to an appropriate substrate, generally a glass plate, is exposed using a photomask and is then cured and developed to form the ready-produced, coloured filter.

The invention additionally provides preferably for the use of the inventively prepared metal compounds or the host-guest compounds thereof, preferably having a BET specific surface area of at least 180 $m^2/g$, such as between 180 $m^2/g$ and 240 $m^2/g$, as pigment for colour filters in liquid-crystal displays.

The invention additionally provides a process for producing colour filters in liquid-crystal displays which comprises the use of the inventively prepared metal compounds or the host-guest compounds thereof, preferably in each case having a BET specific surface area of at least 180 $m^2/g$, such as between 180 $m^2/g$ and 240 $m^2/g$.

The inventively prepared metal compounds or host-guest compounds thereof, or pigment formulations, are outstandingly suitable, moreover, for all pigment end-use applications.

They are suitable, for example, for pigmenting varnishes of all kinds for producing printing inks, distempers or binder covers, for the mass colouring of synthetic, semisynthetic or natural macromolecular substances, such as polyvinyl chloride, polystyrene, polyamide, polyethylene or polypropylene, for example. They can also be used for the spin dyeing of natural, regenerated or artificial fibres, such as cellulose, polyester, polycarbonate, polyacrylonitrile or polyamide fibres, and also for printing textiles and paper. From these pigments it is possible to produce fine, stable, aqueous pigmentations of paints, including emulsion paints, which can be used for colouring paper, for the pigment printing of textiles, for laminate printing or for the spin dyeing of viscose, by grinding or kneading in the presence of nonionic, anionic or cationic surfactants. The pigments prepared by the process of the invention are outstandingly suitable for ink-jet applications and, on the basis of their comparatively high BET specific surface area, for colour filters for liquid-crystal displays.

EXAMPLES

Inventive Example 1

190 g of water-moist paste of diazobarbituric acid with a dry-matter content of 81%, corresponding to 154 g dry, are stirred in 3000 g of water using a laboratory stirrer. 600 mg of seed crystals (nickel salt of azobarbituric acid intercalated with melamine, with a BET specific surface area of 160 m$^2$/g) are added. The mixture is then heated indirectly to 80° C., and at this temperature 134 g of barbituric acid are introduced. After about 30 minutes of subsequent stirring the pH is adjusted to 5.0 using 30% strength potassium hydroxide solution. This is followed by stirring at 80° C. and a pH of 5.0 for 2 hours. The batch is subsequently diluted with water to 5400 g. Subsequently it is heated indirectly to 90° C. and at this temperature 252 g of melamine are introduced. Thereafter 575 g of 22.5% strength nickel chloride solution are added dropwise. 90 minutes of stirring follow, in order to achieve as complete a reaction as possible. The pH is then adjusted to 5.0 using 30% strength potassium hydroxide solution.

The pigment slurry (except for 6 g for Inventive Example 2) is then isolated on a suction filter, washed free of electrolyte, dried at 80° C. in a vacuum drying oven, and ground in a standard laboratory mill for about 2 minutes.

The experiment is repeated five times. Products are obtained which have a BET surface area in the range from 180 to 192 m$^2$/g.

Inventive Example 2

6 g of the pigment slurry of a batch from Inventive Example 1 are introduced initially as a seed crystal suspension. 3000 g of water are added. 190 g of water-moist paste of diazobarbituric acid with a dry-matter content of 81%, corresponding to 154 g dry, are stirred using a laboratory stirrer. The mixture is then heated indirectly to 80° C., and at this temperature 134 g of barbituric acid are introduced. After about 30 minutes of subsequent stirring the pH is adjusted to 5.0 using 30% strength potassium hydroxide solution. This is followed by stirring at 80° C. and a pH of 5.0 for 2 hours. The batch is subsequently diluted with water to 5400 g. Subsequently it is heated indirectly to 90° C. and at this temperature 252 g of melamine are introduced. Thereafter 575 g of 22.5% strength nickel chloride solution are added dropwise. 90 minutes of stirring follow, in order to achieve as complete a reaction as possible. The pH is then adjusted to 5.0 using 30% strength potassium hydroxide solution.

The pigment slurry is then isolated on a suction filter, washed free of electrolyte, dried at 80° C. in a vacuum drying oven, and ground in a standard laboratory mill for about 2 minutes.

This gives a product having a BET surface area of 185 m$^2$/g.

Comparative Example 1

190 g of water-moist paste of diazobarbituric acid with a dry-matter content of 81%, corresponding to 154 g dry, are stirred in 3000 g of water using a laboratory stirrer. The mixture is then heated to 80° C., and at this temperature 134 g of barbituric acid are introduced. After about 30 minutes of subsequent stirring the pH is adjusted to 5.0 using 30% strength potassium hydroxide solution. This is followed by stirring at 80° C. and a pH of 5.0 for 2 hours. The batch is subsequently diluted with water to 5400 g. Subsequently it is heated indirectly to 90° C. and at this temperature 252 g of melamine are introduced. Thereafter 575 g of 22.5% strength nickel chloride solution are added dropwise. 90 minutes of stirring follow, in order to achieve as complete a reaction as possible. The pH is then adjusted to 5.0 using 30% strength potassium hydroxide solution.

The pigment slurry is then isolated on a suction filter, washed free of electrolyte, dried at 80° C. in a vacuum drying oven, and ground in a standard laboratory mill for about 2 minutes.

The experiment is repeated five times. Products are obtained which have a BET surface area in the range from 143 to 177 m$^2$/g.

Comparative Example 2

A 20 m$^3$ reactor with jacket heating/cooling system, stirrer, flow disruptors and pumped circulation system is charged with 6000 litres of hot (80° C.) water, with a stirring speed of 20 rpm. 380 kg of water-moist paste of diazobarbituric acid, with a dry-matter content of 81%, corresponding to 308 kg dry, are introduced.

The temperature is held at 80° C. and at this temperature 268 kg of barbituric acid are introduced. Operation takes place with a pumped circulation, which is set at 15 m$^3$/h. After 1 hour of pumped circulation, the pH is adjusted to 5.0 over the course of 30 minutes, using 30% strength potassium hydroxide solution, which is metered into the pumped circulation. This is followed by 2 hours of subsequent stirring at 80° C. and a pH of 5.0 with pumped circulation. Thereafter the batch is diluted with water to 1500 litres. It is then heated to 90° C. and at this temperature 500 kg of melamine are introduced. The pumped circulation is set to 30 m$^3$/h. Thereafter 1150 kg of 22.5% strength nickel chloride solution are metered in over the course of 30 minutes via the pumped circulation circuit. 90 minutes of subsequent stirring, with pumped circulation, follow, in order to achieve a reaction which is as complete as possible. The pH is then adjusted to 5.0 over the course of 30 minutes, using 30% strength potassium hydroxide solution, which is metered into the pumped circulation.

Subsequently the pH is adjusted to 2.5 over the course of 30 minutes, by metering hydrochloric acid into the pumped circulation circuit. The temperature is raised to 98° C. and heat treatment is carried out for 4 hours. This is followed by adjustment to a pH of 5.0 over the course of 30 minutes, using 30% potassium hydroxide solution, which is metered into the pumped circulation circuit, and the temperature is regulated at 80° C.

The reactor, free of caking, can be very easily discharged virtually to completion. The homogeneous pigment slurry is isolated on a filter press, washed free of electrolyte and dried at 80° C. This gives a highly uniform product with a very narrow particle size distribution and a BET surface area of 167 m$^2$/g.

Inventive Example 3

In the batch of Comparative Example 2, about 20 liters of the product suspension are left in the reactor as seed crystals, and then operation as described in Comparative Example 2 is repeated. This gives a highly uniform product with a very narrow particle size distribution and a BET surface area of 182 m$^2$/g.

The invention claimed is:
1. Process for preparing a host-guest compound comprising a host comprising nickel metal compound of an azo compound that conforms in the form of its free acid to the formula (V)

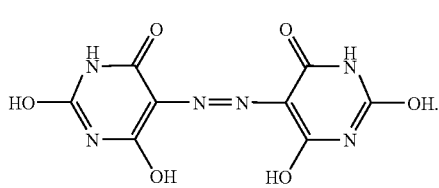
(V)

or to a form tautomeric therewith:
and which contains melamine as a guest compound wherein the host-guest compound has a BET specific surface area of at least 180 $m^2/g$,
the process comprising: reacting the nickel metal compound with the azo compound in the presence of the guest compound and in the presence of seed crystals.

2. Process for preparing the host-guest compounds according to claim 1, wherein the seed crystals used have the same chemical structure as the host-guest compounds to be prepared.

3. Process for preparing the host-guest compounds according to claim 1, wherein the preparation takes place in the presence of 1 ppm-10 000 ppm, of seed crystals, based in each case on the theoretically obtainable amount of the metal compound to be prepared.

4. Process for preparing the host-guest compounds according to claim 1, wherein the seed crystals are in the reaction medium during or prior to azo coupling.

5. Process for preparing the host-guest compounds according to claim 1, wherein the host-guest compound prepared by the process according to one of claim 1 is spray-dried in the form of an aqueous slurry.

6. Photoresist comprising at least one photocurable monomer, at least one photoinitiator and at least one host-guest compound comprising a host comprising nickel metal compound of an azo compound that conforms in the form of its free acid to the formula (V)

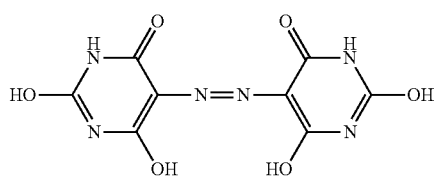
(V)

or to a form tautomeric therewith:
and which contains melamine as a guest compound wherein the host-quest compound has a BET specific surface area of at least 180 $m^2/g$,
wherein the host-guest compound is prepared by reacting the nickel metal compound with the azo compound in the presence of the guest compound and in the presence of seed crystals.

7. Colour filter comprising at least one host-guest compound comprising a host comprising nickel metal compound of an azo compound that conforms in the form of its free acid to the formula (V)

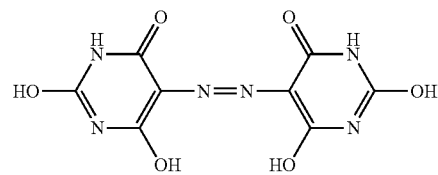
(V)

or to a form tautomeric therewith:
and which contains melamine as a guest compound wherein the host-guest compound has a BET specific surface area of at least 180 $m^2/g$,
wherein the host-guest compound is prepared by reacting the nickel metal compound with the azo compound in the presence of the quest compound and in the presence of seed crystals.

8. Liquid-crystal display comprising at least one colour filter according to claim 7.

9. Process for producing colour filters in liquid-crystal displays, comprising host-guest compounds comprising a host comprising nickel metal compound of an azo compound that conforms in the form of its free acid to the formula (V)

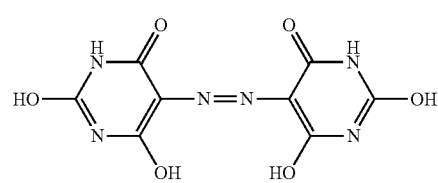
(V)

or to a form tautomeric therewith:
and which contains melamine as a quest compound wherein the host-guest compound has a BET specific surface area of at least 180 $m^2/g$,
wherein the host-quest compound is prepared by reacting the nickel metal compound with the azo compound in the presence of the quest compound and in the presence of seed crystals.

10. Process for preparing pigment formulations, in which at least one host-guest compound comprising a host comprising nickel metal compound of an azo compound that conforms in the form of its free acid to the formula (V)

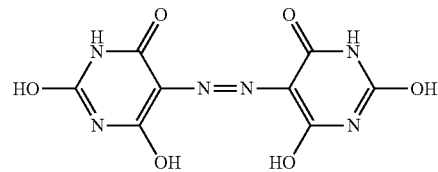
(V)

or to a form tautomeric therewith:
and which contains melamine as a guest compound wherein the host-guest compound has a BET specific surface area of at least 180 $m^2/g$,
wherein the host-guest compound is prepared by reacting the nickel metal compound with the azo compound in the presence of the guest compound and in the presence of seed crystals is mixed with at least one dispersant.

11. A process for manufacturing laminates, colour filters in liquid-crystal displays, or ink-jet printing comprising: introducing a host-guest compound comprising a host comprising nickel metal compound of an azo compound that conforms in the form of its free acid to the formula (V)

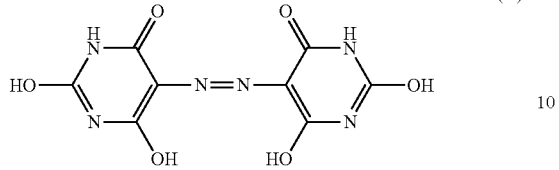

(V)

or to a form tautomeric therewith:
and which contains melamine as a quest compound wherein the host-quest compound has a BET specific surface area of at least 180 m$^2$/g,
wherein the host-quest compound is prepared by reacting the nickel metal compound with the azo compound in the presence of the quest compound and in the presence of seed crystals.

* * * * *